United States Patent
Jackson et al.

(10) Patent No.: US 10,892,712 B2
(45) Date of Patent: *Jan. 12, 2021

(54) STACKED-DIE BULK ACOUSTIC WAVE OSCILLATOR PACKAGE

(71) Applicant: TEXAS INSTRUMENTS INCORPORATED, Dallas, TX (US)

(72) Inventors: Ricky A. Jackson, Richardson, TX (US); Kurt Peter Wachtler, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/747,679

(22) Filed: Jan. 21, 2020

(65) Prior Publication Data

US 2020/0153387 A1 May 14, 2020

Related U.S. Application Data

(63) Continuation of application No. 15/968,435, filed on May 1, 2018, now Pat. No. 10,574,184.

(51) Int. Cl.
*H03B 5/32* (2006.01)
*H03H 9/17* (2006.01)
(Continued)

(52) U.S. Cl.
CPC .......... *H03B 5/326* (2013.01); *H01L 21/565* (2013.01); *H01L 21/78* (2013.01); *H01L 23/3114* (2013.01); *H01L 23/49503* (2013.01); *H01L 23/49541* (2013.01); *H01L 23/49575* (2013.01); *H01L 24/06* (2013.01); *H01L 24/11* (2013.01); *H01L 24/13* (2013.01); *H01L 24/16* (2013.01); *H01L 24/48* (2013.01); *H01L 24/81* (2013.01); *H01L 24/85* (2013.01); *H01L 24/94* (2013.01); *H01L 25/16* (2013.01); *H01L 41/0475* (2013.01); *H01L 41/0533* (2013.01); *H01L 41/25* (2013.01); *H03H 9/0523* (2013.01); *H03H 9/0547* (2013.01); *H03H 9/175* (2013.01); *H01L 24/32* (2013.01); *H01L 24/73* (2013.01); *H01L 2224/13144* (2013.01); *H01L 2224/13147* (2013.01); *H01L 2224/16145* (2013.01); *H01L 2224/16227* (2013.01);
(Continued)

(58) Field of Classification Search
CPC ....................................................... H03B 5/326
USPC ....................................................... 331/107 R
See application file for complete search history.

(56) References Cited

U.S. PATENT DOCUMENTS 7,425,787 B2 9/2008 Larson, III
10,574,184 B2 * 2/2020 Jackson .............. H01L 41/0533
(Continued)

*Primary Examiner* — Joseph Chang
(74) *Attorney, Agent, or Firm* — Ronald O. Neerings; Charles A. Brill; Frank D. Cimino

(57) ABSTRACT

A stacked-die oscillator package includes an oscillator circuit die having inner bond pads, and outer bond pads, and a bulk acoustic wave (BAW) resonator die having a piezoelectric transducer with a first and second BAW bond pad on a same side coupled to a top and bottom electrode layer across a piezoelectric layer. A first metal bump is on the first BAW bond pad and a second metal bump is on the second BAW bond pad flip chip bonded to the inner bond pads of the oscillator circuit die. A polymer material is in a portion of a gap between the BAW and oscillator circuit die.

24 Claims, 4 Drawing Sheets

(51) Int. Cl.
*H01L 41/25* (2013.01)
*H03H 9/05* (2006.01)
*H01L 23/00* (2006.01)
*H01L 41/047* (2006.01)
*H01L 23/495* (2006.01)
*H01L 41/053* (2006.01)
*H01L 23/31* (2006.01)
*H01L 25/16* (2006.01)
*H01L 21/78* (2006.01)
*H01L 21/56* (2006.01)

(52) U.S. Cl.
CPC ............... *H01L 2224/32245* (2013.01); *H01L 2224/48091* (2013.01); *H01L 2224/48106* (2013.01); *H01L 2224/48245* (2013.01); *H01L 2224/73265* (2013.01); *H01L 2924/0715* (2013.01); *H01L 2924/07025* (2013.01); *H01L 2924/14* (2013.01)

(56) References Cited

U.S. PATENT DOCUMENTS

2015/0295556 A1 10/2015 Jacobsen et al.
2015/0318461 A1 11/2015 Jacobsen
2016/0052781 A1 2/2016 Jacobsen et al.

* cited by examiner

STACKED-DIE BULK ACOUSTIC WAVE OSCILLATOR PACKAGE

This application is a Continuation of application Ser. No. 15/968,435 filed May 1, 2018.

FIELD

This Disclosure relates to packaged bulk acoustic wave oscillator devices.

BACKGROUND

Bulk acoustic wave (BAW) devices use the piezoelectric effect to convert electrical energy into mechanical energy resulting from an applied radio frequency (RP) voltage. BAW devices generally operate at their mechanical resonant frequency which is defined as that frequency for which the half wavelength of sound waves propagating in the device is equal to the total piezoelectric layer thickness for a given velocity of sound in the piezoelectric material. BAW resonators operating in the GHz range (e.g., at about 2 GHz) generally have physical dimensions of tens of microns in diameter with thicknesses of a few microns.

For functionality the piezoelectric layer of the BAW device is acoustically isolated from the substrate. There are two conventional device structures for acoustic isolation. The first is referred to as a Thin Film Bulk Acoustic Resonator (FBAR) device. In a FBAR device the acoustic isolation of the piezoelectric layer is achieved by removing the substrate or an appropriate sacrificial layer from beneath the electroded piezoelectric resonating component to provide an air gap cavity.

The second known device structure for providing acoustic isolation is referred to as a Solidly Mounted Resonator (SMR) device. In a SMR device the acoustic isolation is achieved by having the piezoelectric resonator on top of a highly efficient acoustic Bragg reflector that is on the substrate. The acoustic Bragg reflector includes a plurality of layers with alternating high and low acoustic impedance layers. The thickness of each of these layers is fixed to be one quarter wavelength of the resonant frequency. A variant of the SMR device adds a second Bragg mirror on the top of the piezoelectric resonator of BAW resonator. A conventional BAW oscillator leadframe package comprises a BAW die side-by-side with an oscillator circuit die that have bond pads which are coupled die-to-die by bond wires. Gold (Au) bond wires can be used for this die-to-die coupling.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects recognize for a conventional BAW oscillator package with a BAW resonator die and oscillator circuit die side-by-side that are coupled together by bond wires, the bond wires generally add significant parasitic capacitance, and moreover a variation in this capacitance can degrade the performance of the BAW oscillator package. Reducing this parasitic capacitance by eliminating the bond wires while providing good stress isolation for the BAW resonator die can improve the overall BAW oscillator package performance by improving the performance of the BAW resonator die. Assembly manufacturing tolerances are also generally improved by eliminating bond wires for disclosed BAW die-to-oscillator circuit die coupling.

This Disclosure includes a stacked-die BAW oscillator package with bump coupling between a top BAW resonator die that is flip chip attached to a larger area bottom oscillator circuit die which replaces the conventional bond wires coupling the BAW resonator die to the oscillator circuit die. Disclosed aspects include a stacked-die oscillator package including an oscillator circuit die having inner bond pads and outer bond pads, and a BAW resonator die having a piezoelectric transducer thereon having a first and a second BAW bond pad on a same side of the BAW resonator die coupled to a top and bottom electrode layer, that are across a piezoelectric layer. A first metal bump is on the first BAW bond pad, and a second metal bump is on the second BAW bond pad, which are flip chip bonded to the inner bond pads of the oscillator circuit die.

BRIEF DESCRIPTION OF THE DRAWINGS

Reference will now be made to the accompanying drawings, which are not necessarily drawn to scale, wherein.

DETAILED DESCRIPTION

Figure 1A:
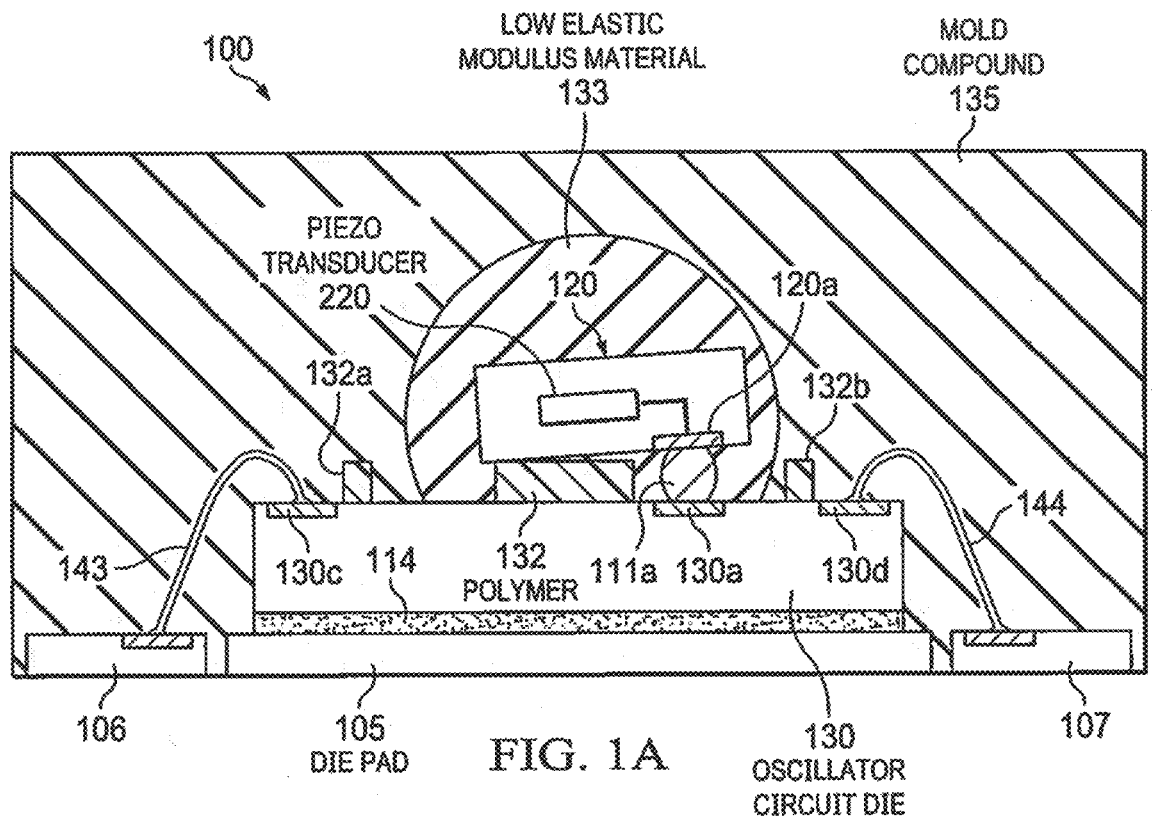
FIG. 1A is a cross sectional view of an example stacked-die BAW oscillator leadframe package with bumps showing bump coupling between bond pads on the BAW die and inner bond pads on the oscillator circuit die.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

FIG. 1A is a cross sectional view of an example stacked-die BAW oscillator leadframe package 100 that includes an oscillator circuit die 130 on a leadframe and a BAW resonator die 120 flip chip bonded to the oscillator circuit die 130, shown with a BAW bond pad 120a bonded by bump 111a to an inner bond pad 130a of the oscillator circuit die 130. As compared to a conventional wire bonded die-to-die arrangement, the flip chip connection utilized by the stacked-die oscillator leadframe package 100 provides shorter electrical routing between the BAW resonator die 120 and oscillator circuit die 130 which reduces the parasitic capacitance. Disclosed bump connections eliminate the generally difficult conventional die-to-die wire bonding process while providing low capacitance interconnections that are more consistent from stacked-die oscillator package to package.

Figures 1B, 1C:
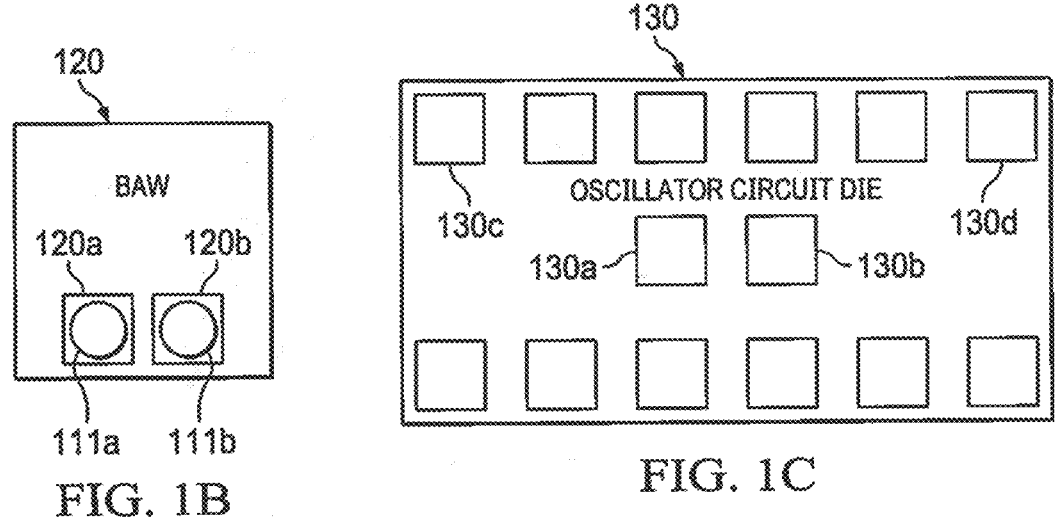
FIG. 1B shows the bumps on the same side of the BAW resonator die.
FIG. 1C shows the inner and outer bond pads on the oscillator circuit die.

The leadframe includes a die pad 105 and a plurality of lead fingers shown as 106, 107. FIG. 1B shows the bumps 111a, 111b on BAW bond pads 120a, 120b that are both on the same side of the BAW resonator die 120, while FIG. 1C shows the inner bond pads 130a, 130b and outer bond pads 130c, 130d, as well other outer bond pads (un-numbered) on the oscillator circuit die 130.

Besides the first metal bump 111a shown in FIG. 1A on the first BAW bond pad 120a there is the second metal bump 111b shown in FIG. 1B on the second BAW bond pad 120b, that are both flip chip bonded to the inner bond pads 130a, 130b of the oscillator circuit die 130. Disclosed stacked-die oscillator package 100 maintains good stress isolation by having the BAW bond pads 120a, 120b and thus all the bumps 111a, 111b on one side of the BAW resonator die 120 to form a diving board type (linear or cantilever-like) bump configuration.

The bumps 111a and 111b can comprise a copper (Cu) post with a different metal cap thereon. A typical solder bump material is a Cu post with a Ni—Pd cap or a AgSn solder material cap. The bumps 111a and 111b can also comprises Au bumps. The outer edges of the bumps 111a and 111b are generally spaced apart by a minimum gap of 30 μm to provide a sufficient minimum clearance to help prevent shorts between the bumps.

Figure 2A:
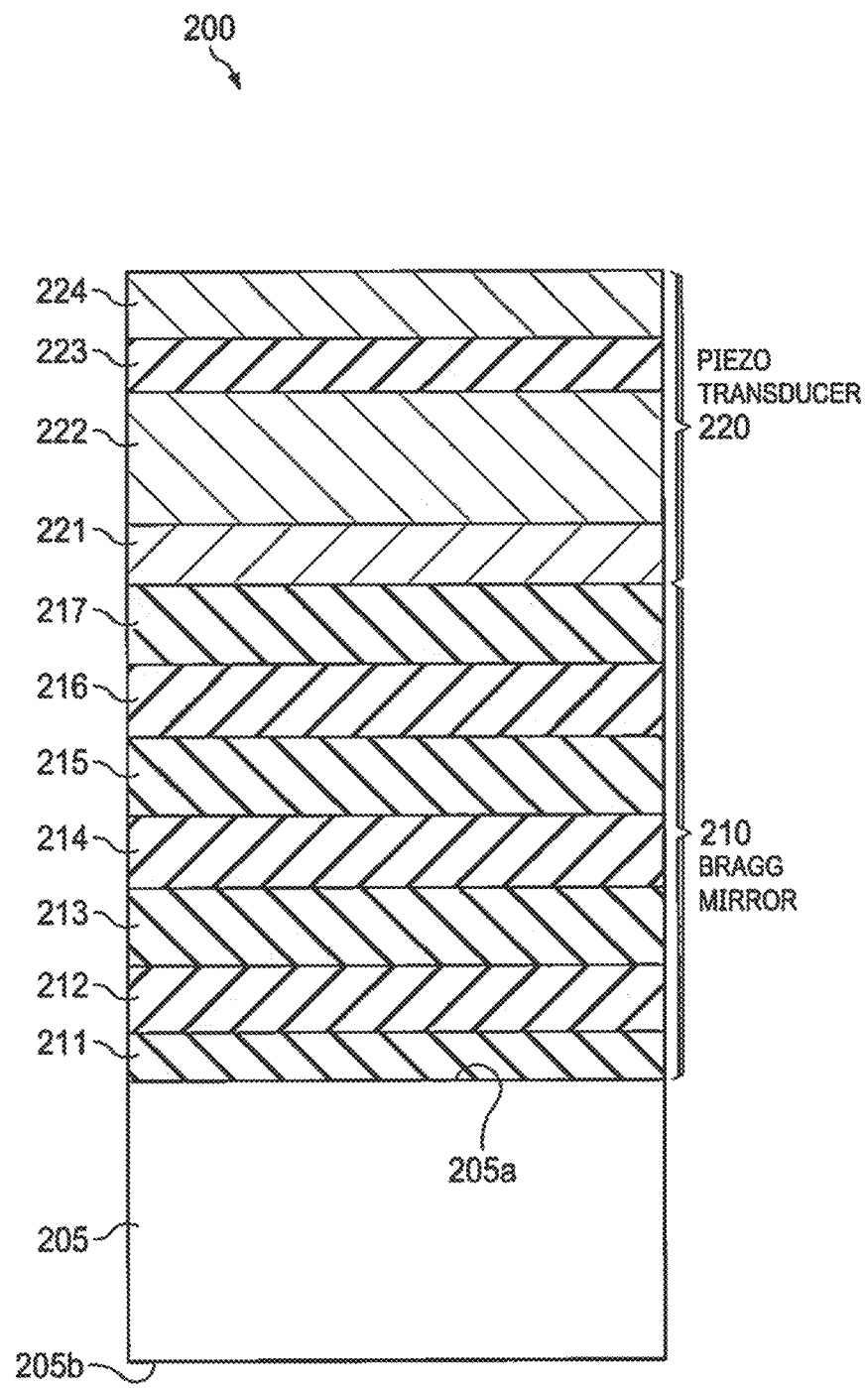
FIG. 2A is a cross sectional depiction that shows a layer stack for a BAW resonator die comprising a SMR device.

The BAW resonator die 120 has a piezoelectric transducer 220 with a first and second BAW bond pad 120a, 120b on a same side of the die coupled to a top and bottom electrode layer across a piezoelectric layer. FIG. 2A described in more detail below shows a piezoelectric transducer 220 including a top electrode layer 224 and bottom electrode layer 221 across a piezoelectric layer 222. Having all the BAW die connections to the oscillator circuit die 130 on one side of the BAW resonator die 120 forms a pivot point with a pivot on the bumps 111a and 111b.

A low elastic modulus material 133 that generally comprises a polymer is shown in FIG. 1A that helps prevent package stress transferring into the BAW resonator die 120. Being on one side a cantilever-like structure formed, with only two semi-flexible points of attachment being the bumps, surrounded with a low elastic modulus material 133 such as silicone or an epoxy, helps protect the BAW die 120 from external stresses. For example, stress from the mold compound 135 itself or from an external force can transfer stress to the BAW die 120 which can degrade its performance. Having the bump connections all on one side also helps to prevent coupling stresses from the oscillator circuit die 130 into the BAW die 120. Although not shown, the BAW die 120 can have more than 2 bond pads each with bumps thereon, such as to add a ground connection to the substrate of the BAW die 120, or to add bond pads and bumps for implementing an on-chip temperature sensor.

If the oscillator circuit die 130 on the bottom of the BAW oscillator package 100 bends for instance, this stress can end up moving the BAW resonator die 120 slightly in the low elastic modulus material 133 versus conventional bending the BAW die and thus inducing stress on the films within the BAW resonator die 120. The outer bond pads 130c, 130d are shown wire bound by bond wire 143 and 144 to lead fingers 106 and 107 of the leadframe, respectively. The oscillator circuit die 130 is attached to the die pad 105 by a die attach material 114, such as a conventional epoxy.

A polymer material 132 or a low elastic modulus material 133 that as described above is generally also a polymer is in a portion of a gap between the BAW resonator die 120 and oscillator circuit die 130 that functions as a stand-off on the side of the BAW die 120 opposite the bumps. Such a stand-off structure helps with planarity during BAW resonator die 120 flip chip attach. The polymer material 132 or a low elastic modulus material 133 when functioning as a standoff as opposed to a single feature can optionally be in the form of a plurality of stripes. The polymer material 132 or a low elastic modulus material 133 can be formed on the BAW die, formed on the oscillator circuit die 130, or be formed on both of these die, generally to a thickness of about 10 μm. The bump is generally about 25 micron high and 30 μm in diameter, so that the bumps are generally taller as compared to a thickness of the polymer material 132, which is shown in FIG. 1A.

The polymer material 132 can comprise a polyimide. The polymer material 132 is also shown in other regions in FIG. 1A shown as regions 132a and 132b forming a surrounding dam for controlling possible bleed-out during the dispensing of a glob of the low elastic modulus material 133 described below which can help with die planarity during bumping. Polymers for the polymer material 132 can comprise polymers other than PI such as SU8 which comprises an epoxy-based material (conventionally used as a negative photoresist) comprising a Bisphenol A Novolac epoxy that is dissolved in an organic solvent (gamma-butyrolactone (GBL) or cyclopentanone, depending on the formulation) with up to 10 wt. % of mixed Triarylsulfonium/hexafluoroantimonate salt as the photoacid generator.

A mold compound 135 encapsulates the stacked-die oscillator package 100, and a low elastic modulus material 133 (which can be the same material describe above that is in a portion of a gap between the BAW resonator die 120 and oscillator circuit die 130 that functions as a stand-off) is over the BAW resonator die 120 for encapsulating the BAW resonator die 120, which can also filling any gaps under the BAW resonator die 120. The low elastic modulus material 133, such as silicone rubber, over the BAW die 120 helps isolate stress from the BAW resonator die 120. For example, stress from the mold compound 135 or external forces can transfer stress to the BAW resonator die 120. As described above, having the all bump connections on one side of the BAW resonator die 120 helps to prevent coupling stresses from the oscillator circuit die 130 with the oscillator die on the BAW resonator die 120. If the oscillator circuit die 130 bends for instance, the stress would end up moving the BAW resonator die 120 slightly in the low elastic modulus material 133 versus bending the BAW resonator die 120 that induces stress on the films within the BAW resonator die 120.

As known in physics, an elastic modulus (or Young's Modulus) is defined as the ratio of longitudinal stress to longitudinal strain. Rubber-like behavior corresponds to a low elastic modulus value of about $10^6$ N/m² (1 MPa) to $10^7$ N/m² (10 MPa). A low elastic modulus material 133 as defined herein is a material that has a 25° C. elastic modulus of ≤50 MPa. Silicone rubber has siloxane bonds (—Si—O—Si), and has a Young's modulus at 25° C. of about 10 to 20 MPa. The low elastic modulus material 133 can be selected to have an elastic modulus of <10 MPa, such as 2 MPa to 10 MPa.

FIG. 2A is a cross sectional depiction that shows a layer stack for a BAW resonator 200 comprising a SMR device. BAW resonator 200 includes a substrate 205 (e.g., silicon) having a top side surface 205a and a bottom side surface 205b. A Bragg mirror 210 is on the top side surface 205a of the substrate. Bragg mirror 210 comprises a plurality of layers with alternating high and low acoustic impedance layers, with the relatively high acoustic impedance layers shown as 212, 214 and 216, alternating with the relatively low acoustic impedance layers 211, 213, 215 and 217. The thickness of each of these layers 211-217 is fixed to be about one quarter wavelength of the desired resonant frequency.

The piezoelectric transducer 220 shown includes a bottom electrode layer 221 that is on layer 217 of the Bragg mirror 210, a piezoelectric layer 222 on the bottom electrode layer 221, a dielectric layer 223 on the piezoelectric layer 222, and a top electrode layer 224 on the dielectric layer. The dielectric layer 223 above the piezoelectric transducer 220 helps to reduce the temperature coefficient of frequency for BAW resonator 200. Although not shown, BAW resonator 200 is generally in a hermetically sealed cavity to protect its top surface.

Figure 2B:
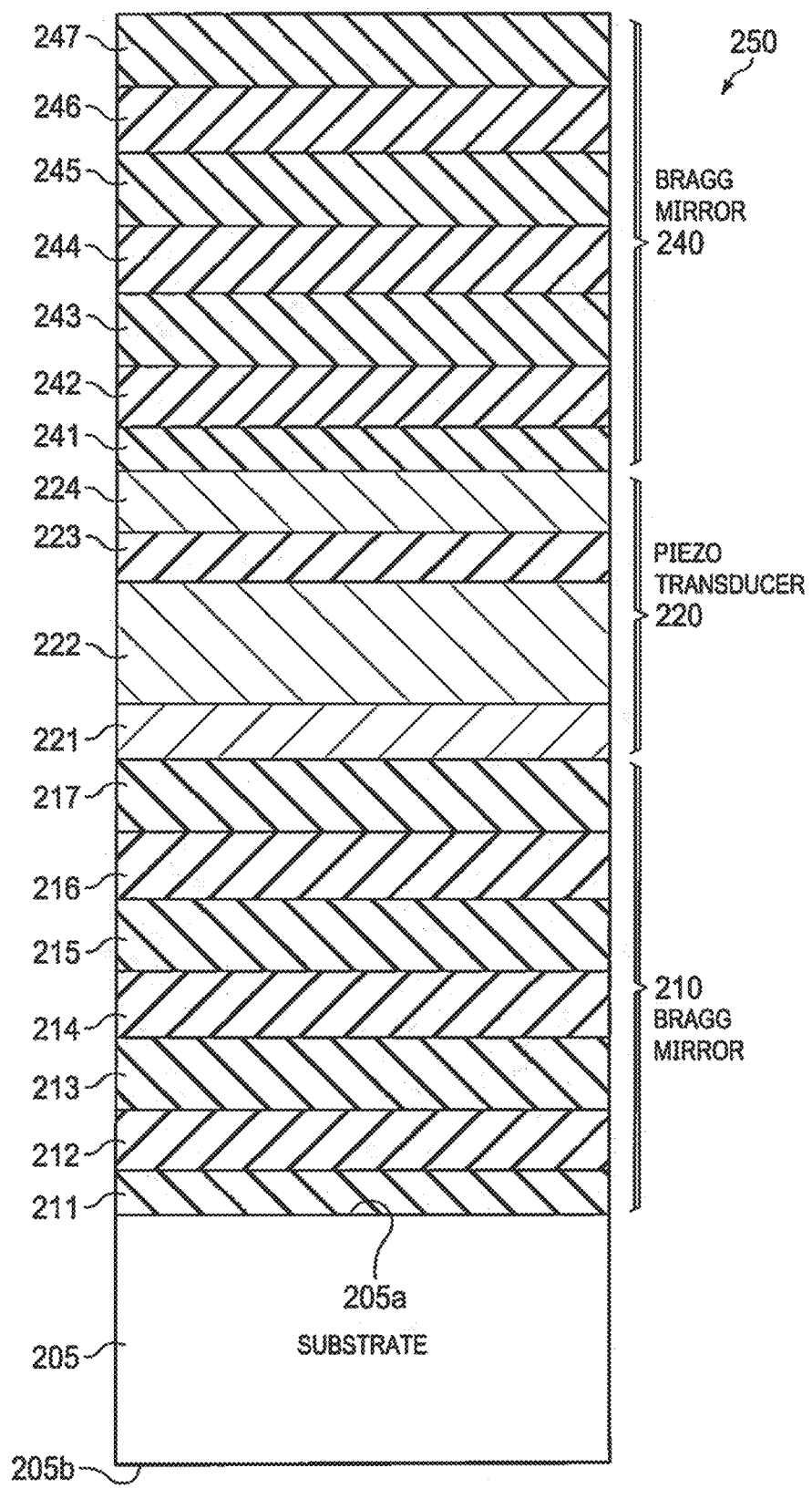
FIG. 2B is a cross sectional depiction that shows a layer stack of a BAW resonator die comprising a dual-Bragg mirror.

FIG. 2B is a cross sectional depiction that shows a layer stack of a BAW resonator die 250 comprising a dual-Bragg mirror including both a bottom Bragg mirror 210, and also top Bragg mirror 240. The top Bragg mirror 240 being on top of the BAW resonator 200 shown in FIG. 2A results in a BAW resonator 250 becoming essentially resistant to frequency shifts caused by the deposition on contaminants on top of the piezoelectric transducer 220. Analogous to bottom Bragg mirror 210, the top Bragg mirror 240 comprises a plurality of layers with alternating high and low acoustic impedance layers, with the relatively high acoustic impedance layers shown as 242, 244 and 246, alternating with the relatively low acoustic impedance layers 241, 243, 245 and 247. The thickness of each of these layers 241-247 is fixed to be about one quarter wavelength of the desired resonant frequency.

As described above bumps (bumps 111a, 111b in FIG. 1B) connect the bond pads on the BAW resonator die 120 to inner bond pads 130a, 130b on the oscillator circuit die 130. The signals that are sent through from the oscillator circuit die 130 travel through metal interconnect on the oscillator circuit die 130 through the inner bond pads 130a, 130b on the oscillator circuit die 130 through the bumps, then through the bond pads on the BAW resonator die 120 and to its resonator through the electrode metal (in layer 221, 224 in FIG. 2A) on the BAW resonator die 120.

Figure 3A:
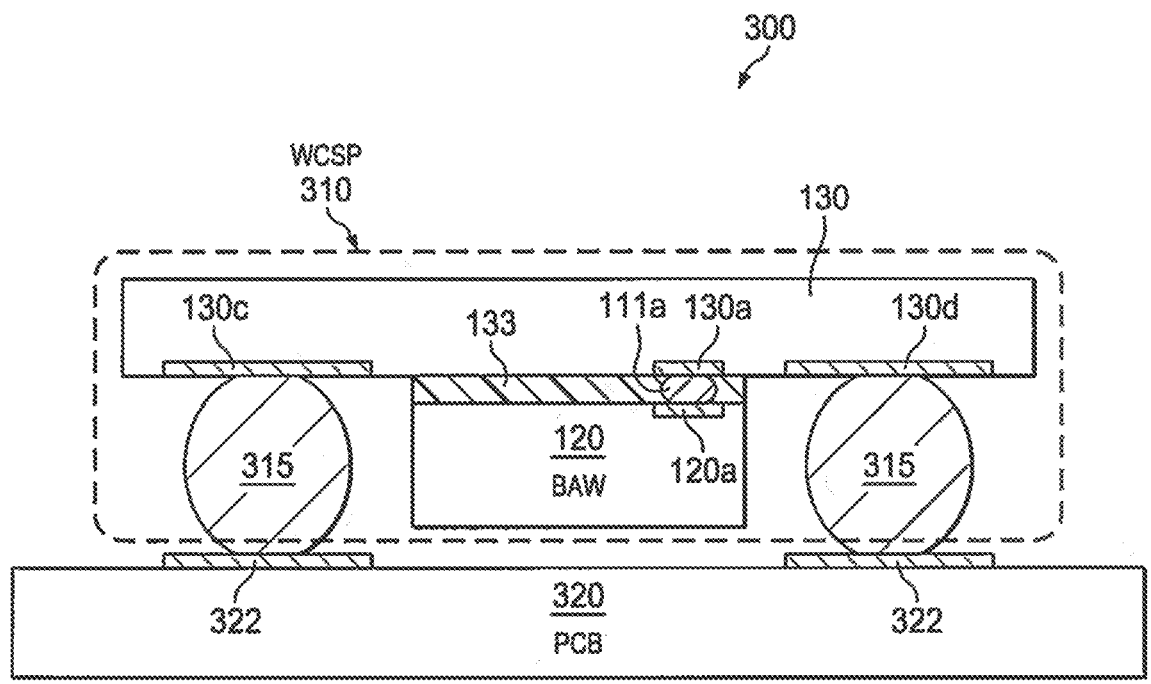
FIG. 3A is a cross sectional view of a printed circuit board (PCB) assembly comprising an example stacked-die BAW oscillator as a Wafer Chip Scale Package (WCSP) with bump coupling between bond pads on the BAW die and inner bond pads on the oscillator circuit die, where the WCSP is assembled onto land pads on the surface a PCB.

FIG. 3A is a cross sectional view of a PCB assembly 300 comprising an example stacked-die BAW oscillator Wafer Chip Scale Package (WCSP) 310 assembled onto a PCB. The WSCP 310 has bump coupling with a bump 111a shown between a bond pad 120a on the BAW die 120 and an inner bond pad 130a on the oscillator circuit die 130. The stacked die 120/130 is assembled by bumps 315 (typically solder balls) that couple the outer bond pads 130c, 130d of the oscillator die 130 onto land pads 322 (e.g., Solder Mask Defined (SMD) pads) on the surface of a printed circuit board (PCB) 320. No bond wires or interposer connections are needed by WCSP 310. A low elastic modulus material 133 is shown in a gap between the BAW resonator die 120 and the oscillator circuit die 130 on the side opposite the bumps shown as bump 111a. Although shown flush to the BAW die 120 edges, the low elastic modulus material 133 will generally extend beyond the edges of the BAW die 120, but can also be recessed relative to these edges.

Figure 3B:
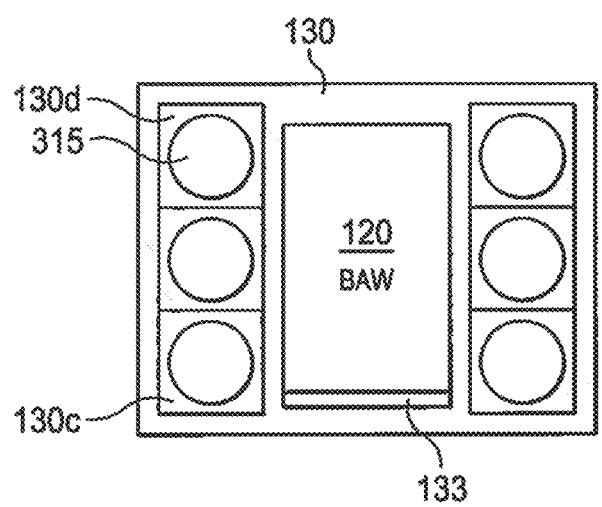
FIG. 3B is a view from underneath the WCSP shown in FIG. 3A.

FIG. 3B is a view from underneath the example stacked-die BAW oscillator WCSP 310 shown in FIG. 3A. In one specific example, the oscillator circuit die 130 is 1250 μm by 1500 μm in area, and the BAW die 120 is 550 un by 878 μm in area, and has a thickness of 150 μm.

Disclosed stacked-die oscillator packages with bump coupling between the BAW resonator die 120 and oscillator circuit die 130 solve the problem for BAW technology needing good stress isolation and lower parasitic capacitance to provide improved stacked-die oscillator package performance. The disclosed bump die attach connections shorten the connection length between the BAW die 120 and the oscillator circuit die 130, and also reduce the parasitic resistance, as well as the parasitic resistance.

Performance parameters for stacked-die oscillator packages include a series resistance resonance frequency (Fs), an anti-resonance or parallel resistance resonance frequency (Fp), and $K_2$eff % value which is defined by the difference between Ps and Pp. The performance improvement provided by disclosed stacked-die oscillator packages comprises a reduced frequency shift due to less parasitic capacitance resulting from disclosed bump connections between the BAW die 120 and the oscillator circuit die 130 as compared to conventional wire bond connections for known side-by-side oscillator packages that are known to shift the frequency. A higher relative $K_2$eff % value is also provided by reduced parasitic capacitance that is known to pull the Fs in closer to Fp. There is also less capacitive loading which results in a wider frequency oscillation window because of the reduced parasitic capacitance. Other advantages of disclosed stacked-die oscillator packages include a lower resistive path for connection of BAW die 120 to oscillator circuit die 130. Shortened connections should also provide a lower risk for capacitive coupling of external noise which can couple in high frequency signals.

Those skilled in the art to which this Disclosure relates will appreciate that many other embodiments and variations of embodiments are possible within the scope of the claimed invention, and further additions, deletions, substitutions and modifications may be made to the described embodiments without departing from the scope of this Disclosure.

The invention claimed is:

1. A stacked-die oscillator package, comprising:
   an oscillator circuit die having a first and a second bond pad;
   a bulk acoustic wave (BAW) resonator die comprising a first BAW bond pad and a second BAW bond pad, a first metal bump on the first BAW bond pad and a second metal bump on the second BAW bond pad flip chip bonded to the first and second bond pads of the oscillator circuit die; and
   a polymer material positioned in a portion of a gap between the BAW resonator die and the oscillator circuit die.

2. The stacked-die oscillator package of claim 1, wherein the bulk acoustic wave (BAW) resonator die comprises a piezoelectric transducer.

3. The stacked-die oscillator package of claim 2, further comprising a Bragg mirror above the piezoelectric transducer.

4. The stacked-die oscillator package of claim 1, wherein the first metal bump and the second metal bump comprise a copper post with a different metal cap thereon.

5. The stacked-die oscillator package of claim 1, wherein the polymer material comprises a polyimide.

6. The stacked-die oscillator package of claim 1, further comprising a low elastic modulus material positioned over the BAW resonator die for encapsulating the BAW resonator die.

7. The stacked-die oscillator package of claim 6, wherein the low elastic modulus material comprises silicone rubber.

8. The stacked-die oscillator package of claim 1, wherein the polymer material comprises a low elastic modulus material.

9. The stacked-die oscillator package of claim 6, wherein the polymer material also provides other polymer material regions including providing a surrounding dam for controlling bleed-out during a dispensing of a glob of the low elastic modulus material.

10. The stacked-die oscillator package of claim 1, wherein the stacked-die oscillator package comprises a wire bound package further comprising a leadframe including a die pad and a plurality of lead fingers, wherein the oscillator circuit die is on the die pad, and bond wires coupling additional bond pads on the oscillator circuit die to the plurality of lead fingers, and a mold compound encapsulating the stacked-die oscillator package.

11. The stacked-die oscillator package of claim 1, wherein the stacked-die oscillator package comprises a Wafer Chip Scale Package (WCSP).

12. A method of assembling a stacked-die oscillator package, comprising:
providing (i) an oscillator circuit die having bond pads comprising a first and a second bond pad, and (ii) a bulk acoustic wave (BAW) resonator die comprising a first BAW bond pad and a second BAW bond pad, a first metal bump on the first BAW bond pad and a second metal bump on the second BAW bond pad;
forming a polymer material on a surface of the oscillator circuit die or on a surface of the BAW resonator die in at least a first polymer material region;
flip chip bonding the BAW resonator die to the oscillator circuit die so that the first metal bump bonds to one of the first and second bond pads, and the second metal bump bonds to another of the first and second bond pads, and so that the first polymer material region is between the BAW resonator die and the oscillator circuit die.

13. The method of claim 12, wherein the providing the BAW resonator die comprises providing a Bragg mirror above the piezoelectric transducer.

14. The method of claim 12, wherein the stacked-die oscillator package further comprises a leadframe including a die pad and a plurality of lead fingers, wherein the oscillator circuit die is on the die pad, further comprising:
wire bonding bond wires between other bond pads of the oscillator circuit die and the plurality of lead fingers, and
forming a mold compound encapsulating the stacked-die oscillator package.

15. The method of claim 14, further comprising before the wire bonding encapsulating the BAW die by dispensing a glob of low elastic modulus material for encapsulating the BAW resonator die.

16. The method of claim 15, wherein the forming the polymer material also provides other polymer material regions including a forming a surrounding dam for controlling bleed-out during the dispensing of the glob of low elastic modulus material.

17. The method of claim 12, wherein the first metal bump and the second metal bump comprise a copper post with a different metal cap thereon.

18. The method of claim 12, wherein the polymer material comprises a polyimide.

19. The method of claim 15, wherein the glob of low elastic modulus material comprises silicone rubber.

20. The method of claim 12, wherein the polymer material comprises a low elastic modulus material, further comprising forming bumps on the other bond pads to provide a Wafer Chip Scale Package (WCSP), and then assembling the bumps on the other bond pads to land pads on a printed circuit board (PCB).

21. The stacked-die oscillator package of claim 13, further comprising a Bragg mirror below the piezoelectric transducer.

22. The stacked-die oscillator package of claim 13, further comprising a first Bragg mirror below the piezoelectric transducer and a second Bragg mirror above the piezoelectric transducer.

23. The stacked-die oscillator package of claim 12, further comprising a printed circuit board (PCB), a first bump coupling a first land pad on the PCB to one of other bond pads on the oscillator circuit die and a second bump coupling a second land pad on the PCB to another of the other bond pads.

24. The stacked-die oscillator package of claim 12, further including a printed circuit board (PCB), a first bump bonding one of other bond pads of the oscillator circuit die to a first land pad on the PCB and a second bump bonding another of the other bond pads of the oscillator circuit die to a second land pad on the PCB.

* * * * *